United States Patent
Liu (10) Patent No.: US 9,165,778 B2
(45) Date of Patent: *Oct. 20, 2015

(54) SYSTEMS AND METHODS FOR CHEMICAL MECHANICAL PLANARIZATION WITH PHOTOLUMINESCENCE QUENCHING

(71) Applicant: Taiwan Semiconductor Manufacturing Company Limited, Hsinchu (TW)

(72) Inventor: I-Shuo Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 40 days.

This patent is subject to a terminal disclaimer.

(21) Appl. No.: 14/097,363

(22) Filed: Dec. 5, 2013

(65) Prior Publication Data

US 2015/0162209 A1    Jun. 11, 2015

(51) Int. Cl.
   *H01L 21/4763*    (2006.01)
   *H01L 21/306*     (2006.01)
   *H01L 21/66*      (2006.01)
   *B24B 37/013*     (2012.01)

(52) U.S. Cl.
   CPC ........ *H01L 21/30625* (2013.01); *B24B 37/013* (2013.01); *H01L 22/26* (2013.01)

(58) Field of Classification Search
   CPC .... B24B 37/013; B24B 49/04; B24B 37/005; B24B 49/02
   USPC ................................................ 451/288–290
   See application file for complete search history.

(56) References Cited

PUBLICATIONS

Gratzel, Michael; Dye-sensitized Solar Cells; Journal of Photochemistry and Photobiology, 4; pp. 145-153; 2003.

Lin, Yu-Ting, Zeng, Tsung-Wei, Lai, Wei-Zong, Chen, Chun-Wei, Lin, Yun-Yue, Chang, Yu-Sheng, Su, Wei-Fang; Efficient Photoinduced Charge Transfer in TiO2 Nanorod/Conjugated Polymer Hybrid Materials; Institute of Physics Publishing, Nanotechnology, 17; pp. 5781-5785; 2006.

Liu, I-Shuo, Lo, Hsi-Hsing, Chien, Chih-Tao, Lin, Yun-Yue, Chen, Chun-Wei, Chen, Yang-Fang, Su, Wei-Fang, Liou, Sz-Chian; Enhancing Photoluminescence Quenching and Photoelectric Properties of CdSe Quantum Dots with Hole Accepting Ligands; Journal of Materials Chemistry, 18; pp. 675-682; 2008.

Liu, I-Shuo et al.; U.S. Appl. No. 14/083,818 Specification: Systems and Methods for Chemical Mechanical Planarization with Fluorescence Detection, filed Nov. 19, 2013. Liu, I-Shuo et al.; U.S. Appl. No. 14/083,818 Drawings: Systems and Methods for Chemical Mechanical Planarization with Fluorescence Detection, filed Nov. 19, 2013.

Robel, Istvan, Subramanian, Vaidyanathan, Kuno, Masaru, Kamat, Prashant; Quantum Dot Solar Cells: Harvesting Light Energy with CdSe Nanocrystals Molecularly Linked to Mesoscopic TiO2 Films; Journal of the American Chemical Society, 128(7); pp. 2385-2393; 2006.

*Primary Examiner* — Mohammad Choudhry
(74) *Attorney, Agent, or Firm* — Jones Day

(57) ABSTRACT

Systems and methods are provided for performing chemical-mechanical planarization on an article. An example system for performing chemical-mechanical planarization includes: a polishing pad configured to support an article for chemical-mechanical planarization (CMP), wherein the article includes a CMP stop material, a polishing head configured to perform chemical-mechanical planarization on the article, a light source configured to provide an incident light, a polishing fluid including a plurality of luminescent particles capable of emitting a fluorescent light in response to the incident light, a fluorescence detector configured to detect the intensity of the fluorescent light, and at least one processor coupled to the fluorescence detector and the polishing head, wherein the at least one processor is configured to control the polishing head based on the detected fluorescent light.

20 Claims, 6 Drawing Sheets

SYSTEMS AND METHODS FOR CHEMICAL MECHANICAL PLANARIZATION WITH PHOTOLUMINESCENCE QUENCHING

FIELD

The technology described in this disclosure relates generally to material processing and more particularly to planarization.

BACKGROUND

Chemical-mechanical polishing/planarization (CMP) is often implemented in semiconductor devices fabrication. A CMP process can be used for planarizing surfaces of a wafer with a combination of chemical and mechanical forces. Mechanical grinding alone may cause surface damages, while wet etching alone cannot attain good planarization. The CMP process involves both the mechanical grinding and the wet etching to generate a smooth surface on a wafer, and prepare the wafer for subsequent processes (e.g., photolithography) in the fabrication of semiconductor devices.

SUMMARY

In accordance with the teachings described herein, systems and methods are provided for performing chemical-mechanical planarization on an article. An example system for performing chemical-mechanical planarization on an article includes a polishing fluid, a polishing pad, and a fluorescence detector. The polishing pad is configured to support an article for chemical-mechanical planarization. The polishing fluid includes a plurality of luminescent particles capable of generating a fluorescent light in response to an incident light and attaching to a stop layer in the article to transfer charges to the stop layer so that an intensity of the fluorescent light decreases. The fluorescence detector is configured to detect the intensity of the fluorescent light.

In an embodiment, a method is provided for performing chemical-mechanical planarization on an article. Chemical-mechanical planarization on an article is started using a polishing fluid to expose a stop layer included in the article. The polishing fluid includes a plurality of luminescent particles capable of generating a fluorescent light in response to an incident light and attaching to a stop layer in the article to transfer charges to the stop layer so that an intensity of the fluorescent light decreases. In response to the intensity of the fluorescent light becoming smaller than a threshold, the chemical-mechanical planarization is stopped.

DETAILED DESCRIPTION

In semiconductor device fabrication, usually a thin material layer (e.g., titanium nitride, titanium oxide) is used as a CMP stop layer for a CMP process and/or an etching hard mask for an etching process that follows the CMP process. Oftentimes, it is hard to control the CMP process with accuracy when the CMP process is to be stopped. The CMP process is usually supposed to stop when material layers on top of the CMP stop layer are removed and the CMP stop layer (e.g., titanium nitride, titanium oxide) is exposed. If the CMP process is not stopped in time, the thin CMP stop layer may be removed and it cannot serve as the etching hard mask. Material layers under the CMP stop layer cannot be protected during the subsequent etching process.

Figure 1A:
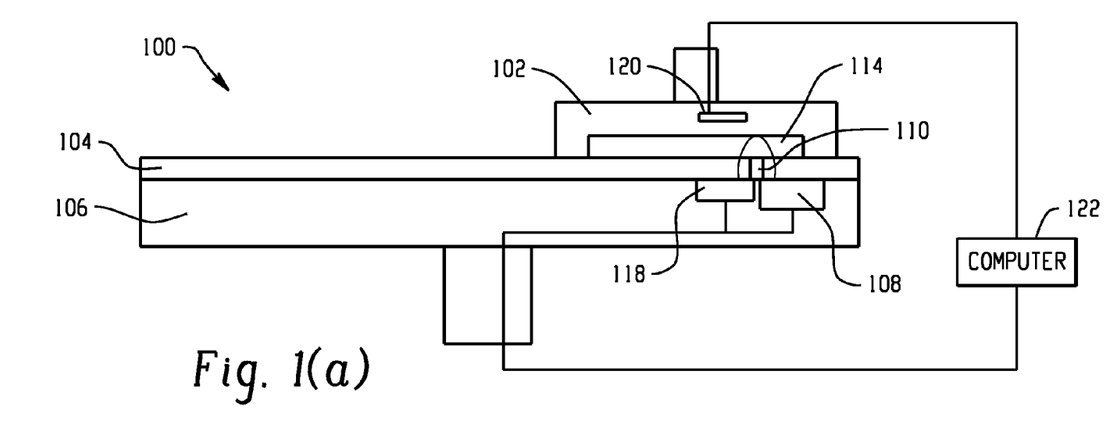
FIG. 1(a)-FIG. 1(b) depict an example diagram showing a CMP system.
Figure 1B:
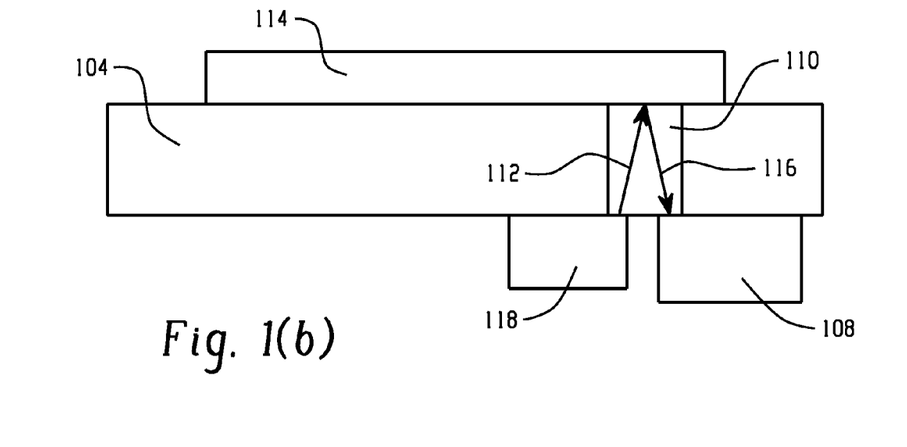

FIG. 1(a)-FIG. 1(b) depict an example diagram showing a CMP system. The CMP system 100 is configured to perform a CMP process with fluorescence detection so that the CMP process stops with accuracy when a CMP stop layer (e.g., nitrides) is exposed.

As shown in FIG. 1(a) and FIG. 1(b), the CMP system 100 includes a polishing head 102, a polishing pad 104, a platen 106, and a fluorescence detector 108. A polishing fluid (not shown) used for the CMP process includes luminescent particles that are capable of generating a fluorescent light 116 in response to an incident light 112 (e.g., from a light source 118) and transferring charges (e.g., electrons or holes) to a CMP stop layer included in a wafer 114. One or more small windows 110 in the polishing pad 104 allows the incident light 112 to pass through and fall on the wafer 114 that includes the CMP stop layer (e.g., a nitride layer), and allows the fluorescent light 116 to pass through to the fluorescence detector 108. The intensity of the fluorescent light 116 is changed when the CMP stop layer is exposed during the CMP process. The fluorescence detector 108 is configured to detect the change of the intensity of the fluorescent light 116 so as to stop the CMP process when the CMP stop layer is exposed after material layers on top of the CMP stop layer are removed.

For example, the windows 110 are fabricated using one or more materials that are approximately transparent to the incident light 112 and the fluorescent light 116. In some embodiments, a first window is used to allow the incident light 112 to pass through, and a second window is used to allow the fluorescent light 116 to pass through. The two windows are fabricated with different materials which are approximately transparent to the incident light 112 and the fluorescent light 116 respectively.

The CMP system 100 further includes a polish-head-rotation controller 120 and a computer 122. For example, the polish-head-rotation controller 120 is configured to control the polishing head 102 to rotate and oscillate to bring the wafer 114 into contact with the polishing pad 104 that moves in the plane of the wafer surface to be planarized (e.g., together with the platen 106). The computer 122 is configured to control the light source 118 and/or the fluorescence detector 108. As an example, the computer 122 compares the detected intensity of the fluorescent light 116 with a predetermined threshold, and causes the polish-head-rotation controller 120 to stop the polishing head 102 if the detected intensity of the fluorescent light 116 is smaller than the predetermined threshold. In certain embodiments, the polishing pad 104 is made of stacks of soft and hard materials (e.g., porous polymeric materials).

Figure 2A:
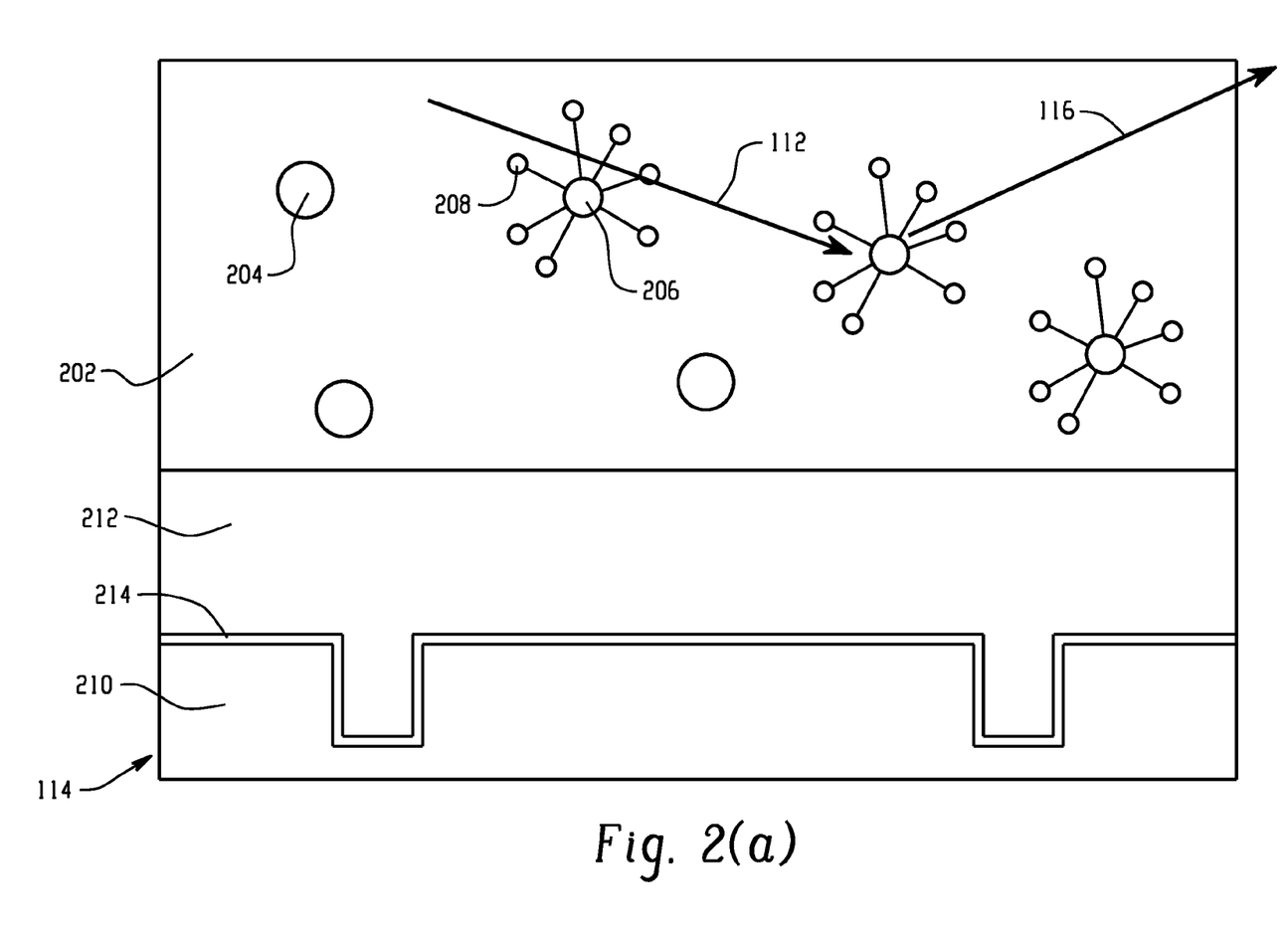
FIG. 2(a) and FIG. 2(b) depict an example diagram showing a polishing fluid including luminescent particles used in the CMP system as shown in FIG. 1(a) and FIG. 1(b).
Figure 2B:
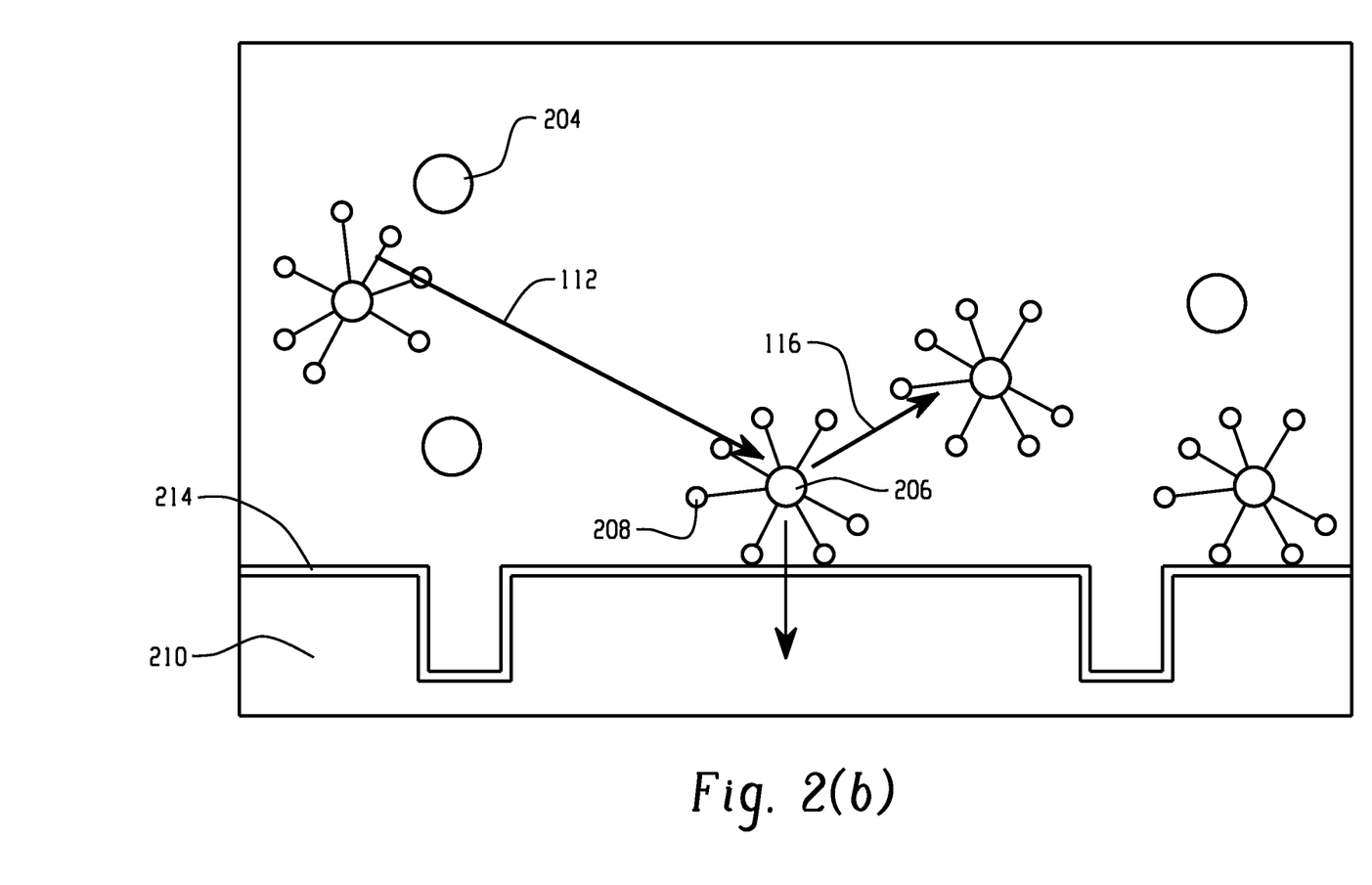

FIG. 2(a) and FIG. 2(b) depict an example diagram showing a polishing fluid including luminescent particles used in the CMP system 100. The polishing fluid 202 includes an abrasive and corrosive chemical slurry (e.g., a colloid). For example, the polishing fluid 202 includes one or more abrasive materials 204, and a plurality of luminescent particles 206 capable of generating the fluorescent light 116 in response to the incident light 112. The luminescent particles 206 each include one or more surfactant particles 208 capable of attaching to a CMP stop layer 214 included in the wafer 114. The wafer 114 includes multiple layers on a substrate 210. One or more material layers 212 (e.g., silicon oxide) are formed on the CMP stop layer 214. For example, the CMP stop layer 214 includes a nitride layer (e.g., titanium oxide, titanium nitride) and does not generate a fluorescent light in response to the incident light 112.

At the beginning of the CMP process, the surfactant particles 208 are attached to the luminescent particles 206 and the fluorescent light 116 has a high intensity. As the CMP process continues, the material layers 212 formed on the CMP stop layer 214 are removed, and at least part of the CMP stop layer 214 is exposed. The surfactant particles 208 begin to attach to the CMP stop layer 214, as shown in FIG. 2(b). Charges (e.g., electrons or holes) are transferred from the luminescent particles 206 to the CMP stop layer 214. In response, the intensity of the fluorescent light 116 begins to decrease. The fluorescence detector 108 detects such changes in the intensity of the fluorescent light 116, and the CMP process is stopped when the intensity of the fluorescent light 116 drops below a threshold. For example, the luminescent particles 206 include CdS, CdSe, CdTe, ZnO, ZnS, ZnSe, ZnTe, InAs, InN, InP, GaN, GaP, GaAs, AlP, or other suitable materials. The abrasive materials 204 include silica or other suitable materials. The surfactant particles 208 include organic molecules that contain one or more hydroxyl-based (e.g., —OH) functional groups, one or more carboxyl-based (e.g., —COOH) functional groups, one or more ammonium-ion-based (e.g., —NH) functional groups, one or more sulfonic-acid-based (e.g., —$SO_3H$) functional groups, or other suitable functional groups.

Figure 3A:
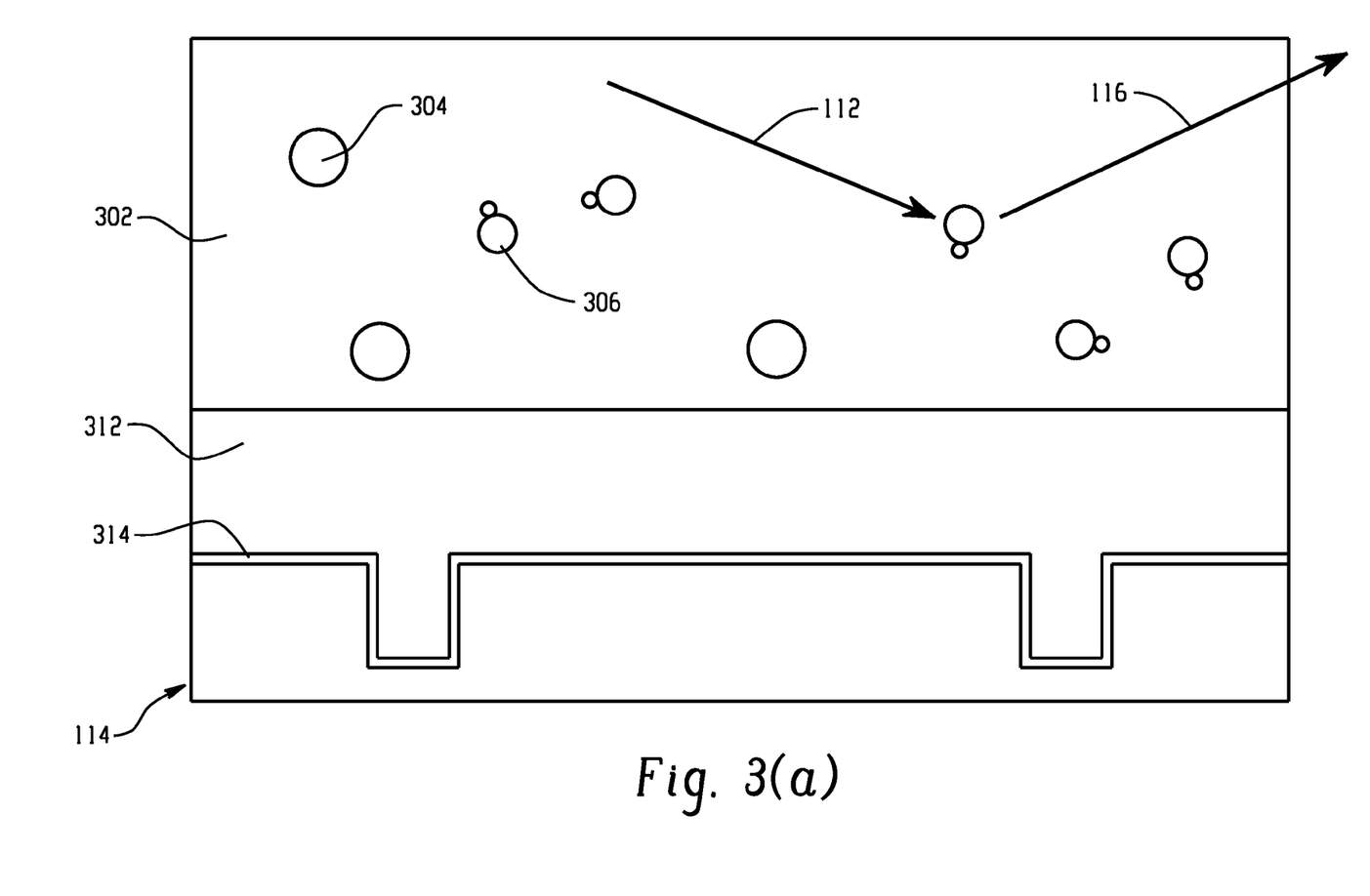
FIG. 3(a) and FIG. 3(b) depict another example diagram showing a polishing fluid including luminescent particles used in the CMP system as shown in FIG. 1(a) and FIG. 1(b).
Figure 3B:
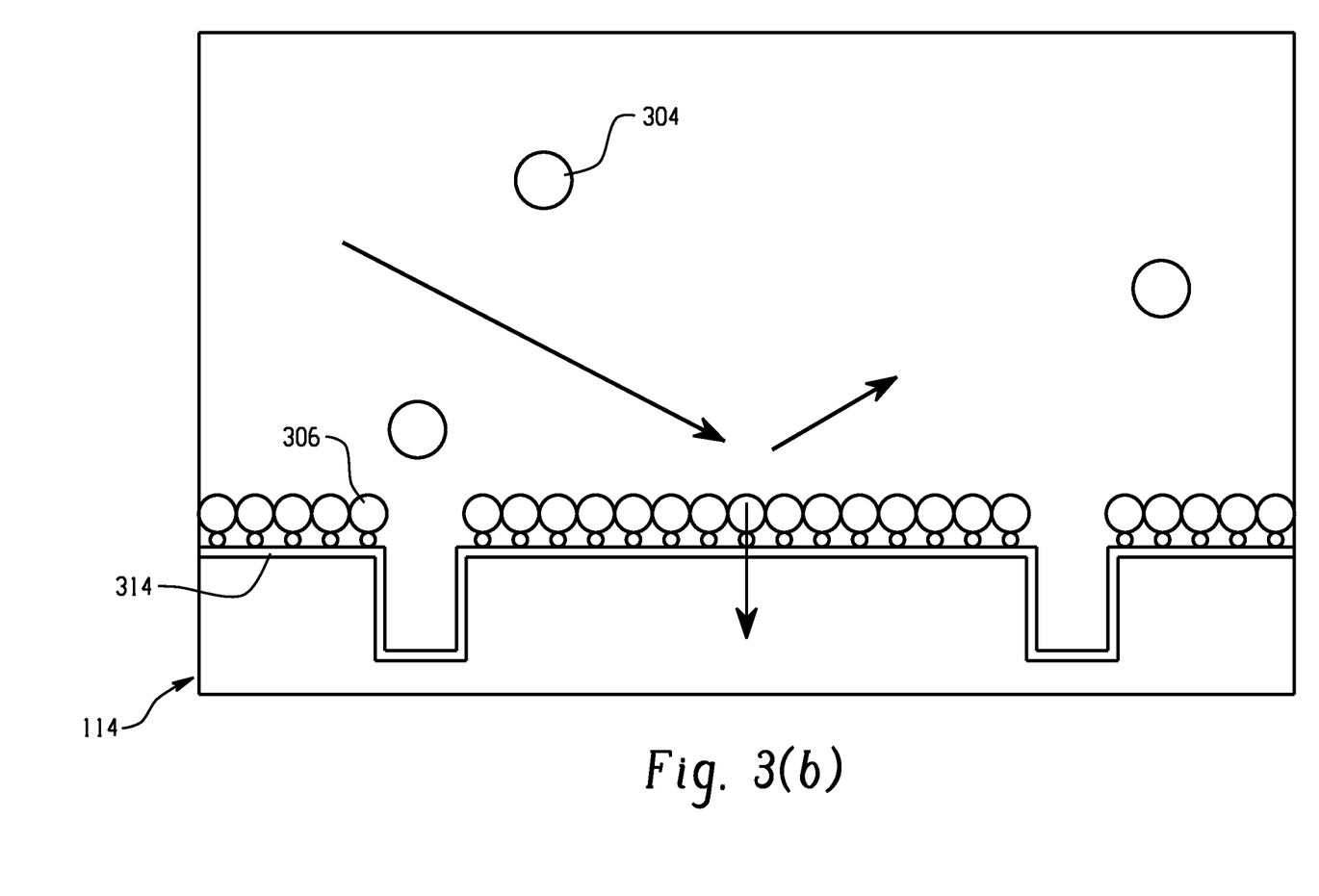

FIG. 3(a) and FIG. 3(b) depict another example diagram showing a polishing fluid including luminescent particles used in the CMP system 100. The polishing fluid 302 includes one or more abrasive materials 304, and a plurality of luminescent particles 306 capable of generating the fluorescent light 116 in response to the incident light 112 and attaching to a CMP stop layer 314 (e.g., titanium oxide, titanium nitride) included in the wafer 114. In some embodiments, one or more material layers 312 (e.g., silicon oxide) are formed on the CMP stop layer 314.

During the CMP process, the material layers 312 formed on the CMP stop layer 314 are removed, and at least part of the CMP stop layer 314 is exposed. The luminescent particles 306 begin to attach to the CMP stop layer 314, as shown in FIG. 3(b). Charges (e.g., electrons or holes) are transferred from the luminescent particles 306 to the CMP stop layer 314. In response, the intensity of the fluorescent light 116 begins to decrease. When most of the luminescent particles 306 attach to the surface of the CMP stop layer 314, the intensity of the fluorescent light 116 is very low. The fluorescence detector 108 detects such changes in the intensity of the fluorescent light 116, and the CMP process is stopped when the intensity of the fluorescent light 116 drops below a threshold. For example, the luminescent particles 306 include certain dye materials, such as EBFP, Azunite, GFPuv, and T-sapphire. In another example, the luminescent particles 306 include certain fluorescence conducting polymer materials, such as MEHPPV and P3HT. The luminescent particles 306 include organic molecules that contain one or more hydroxyl-based (e.g., —OH) functional groups, one or more carboxyl-based (e.g., —COOH) functional groups, one or more ammonium-ion-based (e.g., —NH) functional groups, one or more sulfonic-acid-based (e.g., —$SO_3H$) functional groups, or other suitable functional groups. The abrasive materials 304 include silica or other suitable materials.

Figure 4:
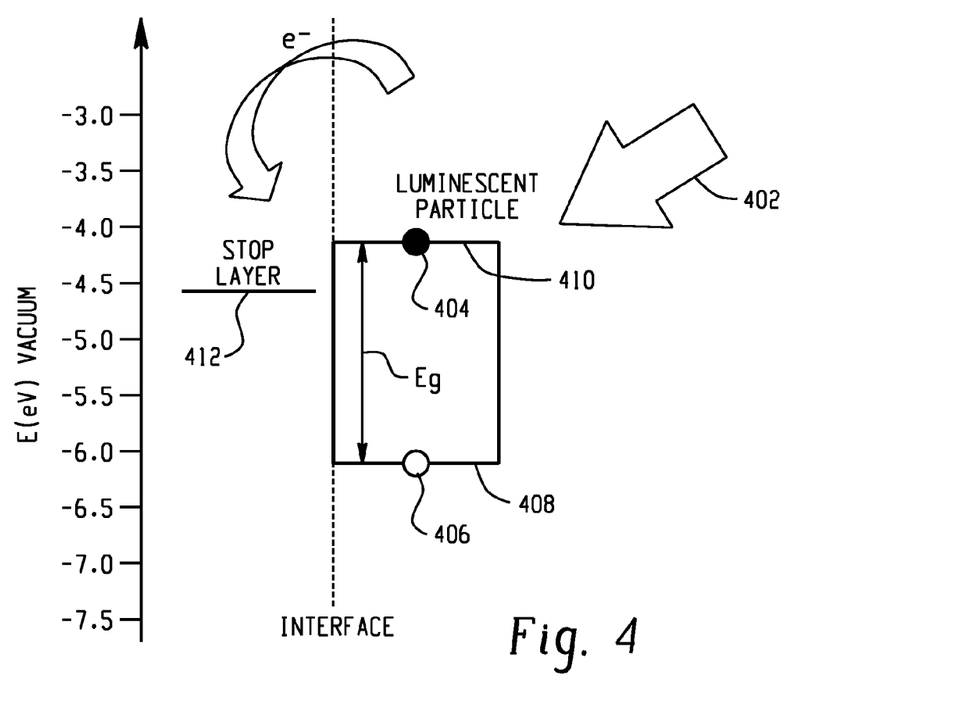
FIG. 4 depicts an example band diagram showing electrons being transferred from a luminescent particle to a CMP stop layer.

FIG. 4 depicts an example band diagram showing electrons being transferred from a luminescent particle to a CMP stop layer. As shown in FIG. 4, a luminescent particle is in contact with a CMP stop layer. In response to an incident light 402, one or more electrons 404 of the luminescent particle are excited from a first energy level 408 to a second energy level 410, leaving behind one or more holes 406 at the first energy level 408. The second energy level 410 is higher than an energy level 412 corresponding to a conduction band of the CMP stop layer, and the one or more electrons 404 flow from the luminescent particle to the CMP stop layer. In some embodiments, the energy of the incident light is larger than a difference between the first energy level 408 and the second energy level 410 which corresponds to a band gap of the luminescent particle (e.g., Eg). For example, the first energy level 408 is at about −6.0 eV, and the second energy level 410 is at about −4.0 eV. The energy level 412 of the CMP stop layer is at about −4.5 eV.

Figure 5:
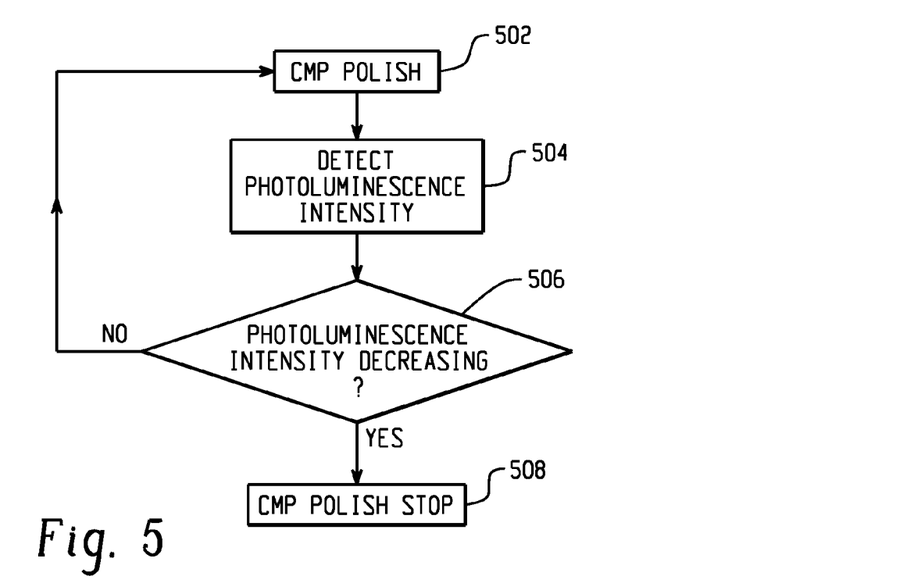
FIG. 5 depicts an example flow chart for performing CMP on an article.

FIG. 5 depicts an example flow chart for performing CMP on an article. At 502, the CMP process begins on an article (e.g., a wafer) including a CMP stop layer. A polishing fluid that is used for the CMP process includes a plurality of luminescent particles capable of generating a fluorescent light in response to an incident light and attaching to the CMP stop layer included in the article. Once the luminescent particles attach to the CMP stop layer, electric charges (e.g., electrons, holes) transfer from the luminescent particles to the CMP stop layer and as a result an intensity of the fluorescent light decreases. At 504, the intensity of the fluorescent light is detected. At 506, a determination whether the intensity of the fluorescent light is decreasing (e.g., becoming smaller than a threshold) is made. If the intensity of the fluorescent light is decreasing (e.g., becoming smaller than a threshold), it indicates that at least a large part of the CMP stop layer is exposed. The CMP process ends to avoid removing the CMP stop layer, at 508. Otherwise, the CMP process continues.

For example, the luminescent particles include CdS, CdSe, CdTe, ZnO, ZnS, ZnSe, ZnTe, InAs, InN, InP, GaN, GaP, GaAs, AlP, EBFP, Azunite, GFPuv, T-sapphire, MEHPPV, P3HT, or other suitable materials. In some embodiments, the luminescent particles include surfactant particles capable of attaching to the stop layer. As an example, the surfactant particles include organic molecules that contain one or more hydroxyl-based functional groups, one or more carboxyl-based functional groups, one or more ammonium-ion-based functional groups, one or more sulfonic-acid-based functional groups, or other suitable functional groups.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, on, under, etc. that are used for descriptive purposes only and are not to be construed as limiting. The embodiments of a device or article described herein can be manufactured, used, or shipped in a number of positions and orientations. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "under" as used herein (including in the claims) may not indicate that a first layer/structure "under" a second layer/structure is directly under and in immediate contact with the second layer/structure unless such is specifically stated; there may be one or more third layers/structures between the first layer/structure and the second layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials).

What is claimed is:

1. A system for performing chemical-mechanical planarization, comprising:
    a polishing pad configured to support an article for chemical-mechanical planarization (CMP), wherein the article includes a CMP stop material;
    a polishing head configured to perform chemical-mechanical planarization on the article;
    a light source configured to provide an incident light;
    a polishing fluid including a plurality of luminescent particles capable of emitting a fluorescent light in response to the incident light;
    a fluorescence detector configured to detect the intensity of the fluorescent light; and
    at least one processor coupled to the fluorescent detector and the polishing head, wherein the at least one processor is configured to control the polishing head based on the detected fluorescent light;
    wherein the luminescent particles are capable of attaching the CMP stop material during CMP and transferring a plurality of electrons or holes to the CMP stop material upon attachment to the CMP stop material.

2. The system of claim 1, wherein the article further includes a CMP stop layer composed by the CMP stop material.

3. The system of claim 2, wherein:
    the luminescent particles are capable of absorbing the incident light to excite one or more electrons from a first energy level to a second energy level; and
    the one or more electrons excited to the second energy level are capable of being transferred to a third energy level corresponding to a conduction band of the CMP stop layer.

4. The system of claim 3, wherein a difference between the first energy level and the second energy level corresponds to a band gap associated with the luminescent particles.

5. The system of claim 3, wherein energy of the incident light is larger than a difference between the first energy level and the second energy level.

6. The system of claim 1, wherein the polishing head is configured to perform chemical-mechanical planarization to expose the CMP stop material.

7. The system of claim 6, wherein the polishing head is configured to stop the chemical-mechanical planarization when the intensity of the detected fluorescent light is smaller than a threshold.

8. The system of claim 6, wherein the polishing head is configured to press the article against the polishing pad.

9. The system of claim 1, wherein the CMP stop material includes at least one of titanium nitride and titanium oxide.

10. The system of claim 1, wherein the luminescent particles include at least one of CdS, CdSe, CdTe, ZnO, ZnS, ZnSe, ZnTe, InAs, InN, InP, GaN, GaP, GaAs, AlP, EBFP, Azunite, GFPuv, T-sapphire, MEHPPV, and P3HT.

11. The system of claim 1, wherein a luminescent particle includes one or more surfactant particles capable of attaching to the CMP stop material.

12. The system of claim 11, wherein the surfactant particles include organic molecules that contain at least one of a hydroxyl-based functional group, a carboxyl-based functional group, a ammonium-ion-based functional group and a sulfonic-acid-based functional group.

13. The system of claim 1, wherein the polishing head is further configured to perform the chemical-mechanical planarization to remove at least one of materials formed over the CMP stop material in the article.

14. The system of claim 1, wherein the polishing pad includes one or more areas for the incident light and the fluorescent light to pass through.

15. The system of claim 14, wherein the one or more areas are fabricated using one or more particular materials approximately transparent to the incident light and the fluorescent light.

16. A method for performing chemical-mechanical planarization, the method comprising:
    polishing an article by a chemical-mechanical planarization (CMP) using a polishing fluid including a plurality of luminescent particles capable of emitting a fluorescent light in response to an incident light; and
    stopping the chemical-mechanical planarization in response to an intensity of the fluorescent light;
    wherein the article includes a CMP stop material and the luminescent particles are capable of attaching the CMP stop material during the CMP and transferring a plurality of electrons or holes to the CMP stop material upon attachment to the CMP stop material.

17. The method of claim 16, wherein the CMP stop material includes at least one of titanium nitride and titanium oxide.

18. The method of claim 16, wherein the emitter particles include at least one of CdS, CdSe, CdTe, ZnO, ZnS, ZnSe, ZnTe, InAs, InN, InP, GaN, GaP, GaAs, AlP, EBFP, Azunite, GFPuv, T-sapphire, MEHPPV, and P3HT.

19. The method of claim 16, wherein a luminescent particle includes one or more surfactant particles capable of attaching the CMP stop material.

20. The method of claim 19, wherein the surfactant particles include organic molecules that contain at least one of a hydroxyl-based functional group, a carboxyl-based functional group, a ammonium-ion-based functional group, and a sulfonic-acid-based functional group.

\* \* \* \* \*